(12) United States Patent
Morris

(10) Patent No.: US 6,433,628 B1
(45) Date of Patent: Aug. 13, 2002

(54) WAFER TESTABLE INTEGRATED CIRCUIT

(75) Inventor: Bernard Lee Morris, Emmaus, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/859,316

(22) Filed: May 17, 2001

(51) Int. Cl.[7] .............................................. H01L 25/00
(52) U.S. Cl. .................................... 327/565; 324/765
(58) Field of Search ................................. 327/564, 565, 327/595; 324/763, 765; 257/48

(56) References Cited

U.S. PATENT DOCUMENTS

| | | | | |
|---|---|---|---|---|
| 5,760,643 A | * | 6/1998 | Whetsel | 327/403 |
| 5,969,538 A | * | 10/1999 | Whetsel | 324/763 |
| 5,986,320 A | * | 11/1999 | Kawano | 257/209 |
| 5,990,695 A | | 11/1999 | Daugherty, Jr. | 324/758 |
| 6,127,729 A | * | 10/2000 | Fukuda | 257/208 |
| 6,356,095 B1 | * | 3/2002 | Komoriya | 324/763 |

* cited by examiner

*Primary Examiner*—My-Trang Nuton
(74) *Attorney, Agent, or Firm*—Synnestvedt & Lechner LLP

(57) ABSTRACT

A wafer testable integrated circuit (IC) and method for wafer testing the IC. The IC includes outside row buffer areas, inside row buffer areas having bi-directional buffers, routing circuitry between the buffer areas, and IC logic (including internal IC logic directly accessible through at least one inside row buffer area). The internal logic is indirectly accessible through outside row buffer areas via the routing circuitry coupled between the outside row buffer areas and the inside row buffer areas, and the bi-directional buffers of the inside row buffer areas. The method includes supplying a test signal to a first outside row buffer area, routing the test signal from the first outside row buffer area to internal logic accessible through one or more inside row buffer areas, applying the test signal to the internal logic to generate a resultant signal, routing the resultant signal to a second outside row buffer area, and interpreting the resultant signal at the second outside row buffer area.

24 Claims, 4 Drawing Sheets

WAFER TESTABLE INTEGRATED CIRCUIT

FIELD OF THE INVENTION

The present invention relates to integrated circuits and, more particularly, to wafer testing integrated circuits.

BACKGROUND OF THE INVENTION

Electronic circuits are routinely fabricated on semiconductor wafers to form integrated circuits (ICs). Typically, each IC contains complex circuitry (referred to herein as "wafer logic") which needs to be tested to ensure that it functions as intended. Prior to performing a relatively expensive packaging procedure, in which the IC is encapsulate in a protective package, the IC is "wafer tested" and defective ICs are discarded, thereby realizing significant cost savings. Unfortunately, due to the architecture of existing ICs and the available wafer testing equipment to test them, some ICs (e.g., Flip-Chip ICs) are unable to be fully tested during wafer testing. Flip-Chip ICs contain semiconductor wafers with a large number of bonding pads. The semiconductor wafers are inverted ("flipped") prior to packaging to facilitate connections between the bonding pads and leads of the package. The inability to fully wafer test these ICs results in defective ICs being packaged, and an associated increase in production costs. Accordingly, improved methods and apparatuses which enable ICs such as Flip-Chip ICs to be tested fully during wafer test are useful.

FIG. 1 depicts a typical IC 10 prior to packaging. Older ICs have buffer areas positioned solely along the perimeter of the IC 10. The outside row buffer area 14 is typical of these outside row buffer areas. For example, there are 10 outside row buffer areas 14 along the left hand perimeter of the IC 10. The IC 10 is a semiconductor wafer which has logic dispersed throughout the entire wafer. For descriptive purposes, the logic dispersed through out the IC 10 is referred to as wafer logic 12.

Each outside row buffer area 14 includes an outside row bonding pad 14A which is electrically connected to wafer logic 12 within the IC 10 through an outside row buffer 14B. The outside row buffers 14B are fabricated within the IC 10 and, therefore, are not visible (represented through the use of dashed lines). As long as all of the buffer areas 14 are positioned along the perimeter of the IC 10, the wafer logic 12 of the IC 10 can be wafer tested filly prior to packaging by use of conventional mechanical probes (representatively shown by probe element 18 in FIG. 1) which contact the outside row bonding pads 14A. The probe element 18 temporarily contacts the bonding pads 14A during testing to supply and interpret testing signals of the IC 10. A conventional cantilever test probe is an example of a probe element that may be used for wafer testing ICs.

Typically, the outside row buffer 14B comprises an input stage which permits signals impressed at the outside row bonding pad 14A to reach the wafer logic 12, an output stage which permits signals from the wafer logic 12 to reach the outside row bonding pad 14A, or an input stage and output stage to permit two-way communication between the outside row bonding pad 14A and the wafer logic 12.

In newer ICs, in addition to the previously described outside row buffer areas 14, inside row buffer areas are positioned in a central portion of the IC 10, as shown in FIG. 1, to establish contact with the increasingly complex circuitry of these ICs 10. The inside row buffer area 16 is typical of these inside row buffer areas. For example, there are 4 inside row buffer areas 16 along the left hand interior region of the IC 10. The inside row buffer area 16 includes an inside row bonding pad 1 6A electrically connected to the wafer logic 12 within the IC 10 through an inside row buffer 16B.

These modern ICs 10 may contain logic which requires that one or more inside row buffer areas 16 be contacted during testing. For example, as shown in FIG. 1, internal logic 12A accessible between inside row buffer area A and inside row buffer area Z would require that these inside row buffer areas be contacted to properly test the internal logic 12A. Also, logic within the IC 10 may be such that it is testable only between outside row buffer areas 14 and inside row buffer areas 16.

FIG. 1A depicts a cross sectional view of a Flip-Chip protective package 20 for housing the IC 10 (FIG. 1). The protective package 20 contains an array of leads, such as lead 22, which correspond to the bonding pads of the IC 10, e.g., bonding pads 14A, 16A (FIG. 1). The IC 10 depicted in FIG. 1 is only one of many possibilities for buffer area placement. For example, the buffer areas could be placed in a regular grid pattern that covers the entire chip.

In typical ICs, all of the buffer areas are physically positioned in close proximity to one another due to a relatively large number of boding pads on a relatively small piece of semiconductor material. In order to contact individual bonding pads, the probe elements 18 include very fine wires for contacting the bonding pads during testing. This makes it difficult to contact an outside row bonding pad with one probe and an inside row bonding pad behind the outside row bonding pad with another probe without the probes interfering with one another. If the probe elements contact one another during testing, a short will occur, thereby precluding the testing process.

With respect to Flip-Chips, the existing testing method is to test the portions of the wafer logic 12 accessible via the outside row buffer areas 14 during the wafer testing process (e.g., using probe elements 18) and then test the inaccessible logic (e.g., the internal logic 12A) after the IC 10 is packaged within the protective package 20 (i.e., "package testing"). During package testing, probes are attached to the leads 22 of the package 20 and testing signals are applied to test the internal logic 12A by submitting a test signal to a lead 22 attached to an appropriate inside row buffer area (e.g., buffer area A) coupled to an input of the internal logic 12A and examining the output at a lead attached to another appropriate inside row buffer area (e.g., buffer area Z) coupled to an output of the internal logic 12A. This enables the internal logic 12A to be tested, however, the IC 10 must already be packaged to use this testing method. Once the chip is placed within the package it cannot later be removed easily. Since packaging ICs is a relatively expensive portion of the cost of producing a packaged IC, it is desirable to be able to fully test all IC logic prior to packaging (i.e., during wafer testing).

Prior art attempts to fully wafer test ICs include the use of a probe known as a membrane probe. An example of a membrane probe is depicted in U.S. Pat. No. 5,990,695 to Daugherty, Jr. Membrane probes are very expensive. In addition, the use of membrane probes would require the purchase of new test equipment for wafer testing. The membrane probes and new test equipment result in additional expenses which increase production costs.

Since fully testing an IC having inside row buffer areas during wafer testing is desirable for reducing production costs, and present systems either do not allow the IC to be fully tested or are expensive, there has been a long felt need in the industry for improved ICs and methods for testing these ICs which allow them to be fully and inexpensively tested during wafer testing. The present invention solves this need among others.

SUMMARY OF THE INVENTION

The present invention discloses an IC which is fully testable during wafer test using conventional testing equipment, and a method for testing the IC. This IC and method permit the IC to be fully tested prior to packaging. Accordingly, defective ICs which appear to be functioning properly using conventional wafer testing techniques can be identified as defective before packaging using the present invention. By detecting the defective ICs prior to packaging, the IC and method of the present invention ensure that defective ICs are not packaged, thereby decreasing production costs. Also, since conventional testing equipment can be used, the present invention can be implemented inexpensively.

The wafer testable IC includes an outside row buffer area, an inside row buffer area with a bi-directional buffer coupled to logic within the IC, routing circuitry coupled between the outside row buffer area and the inside row buffer area for coupling the inside row buffer area and the outside row buffer area such that a signal can be passed between the outside row buffer area and the logic within the IC coupled to the inside row buffer area. In addition, the IC may include another outside row buffer area wherein the logic can be tested by supplying a test signal to one of the outside row buffer areas and observing a resultant signal at the other outside row buffer area.

The method of wafer testing internal logic of an IC includes supplying a test signal to a bonding pad of an outside row buffer area having an input stage, routing the test signal from the outside row buffer area to an input of the internal logic, applying the test signal to the internal logic to generate a resultant signal at an output of the internal logic, routing the resultant signal to another outside row buffer area having an output stage, and interpreting the resultant signal at a bonding pad of the other outside row buffer area.

DETAILED DESCRIPTION OF THE INVENTION

The present invention relates to an improved IC and method for wafer testing this IC which enables internal logic within the IC to be wafer tested prior to packaging. The invention finds particular utility in the creation and testing of Flip-Chip ICs, however, the invention can be utilized wherever an IC design includes buffer areas having bonding pads which are not positioned along the perimeter of the IC. In general, the IC comprises outside row buffer areas and inside row buffer areas having bi-directional buffers. In addition, the IC contains routing circuitry which enables the inside row buffer areas to be accessible from one or more outside row buffer areas.

Figure 1:
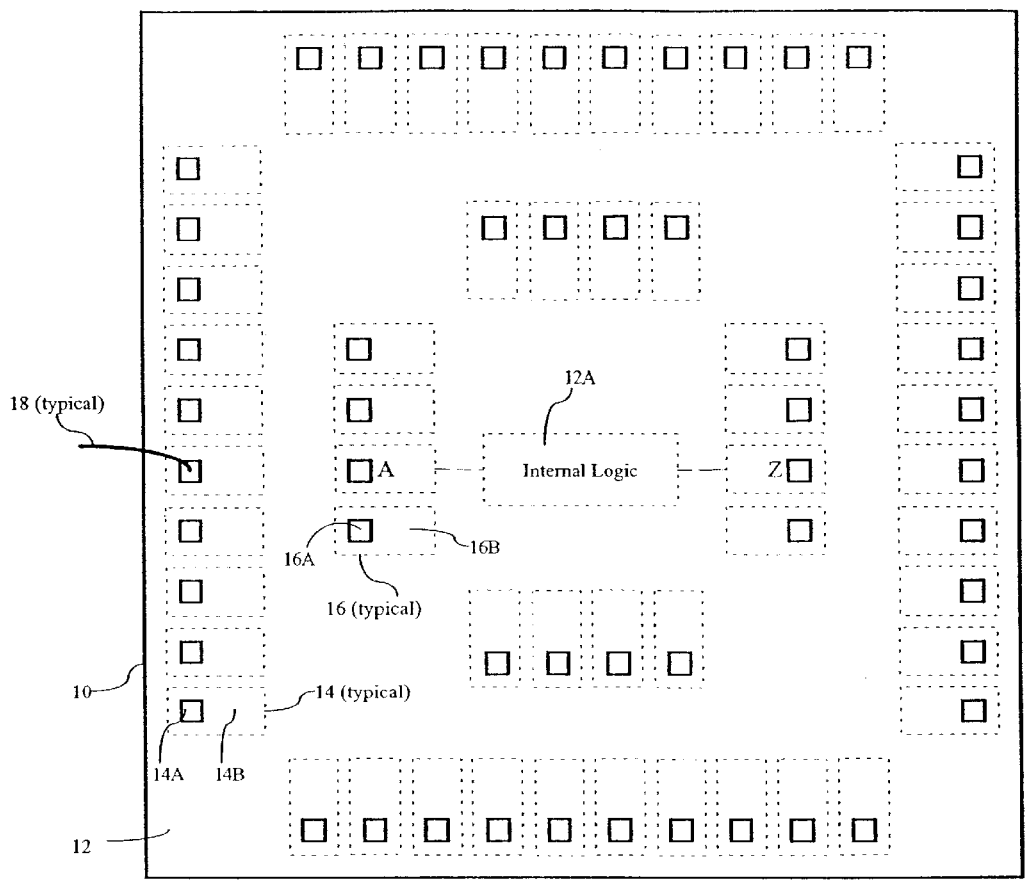
FIG. 1 is a block diagram of a prior art IC prior to packaging.
Figure 1A:
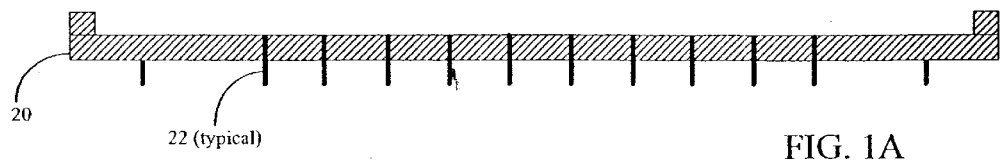
FIG. 1A is a block diagram of a prior art protective package for housing the IC of FIG. 1.
Figure 2:
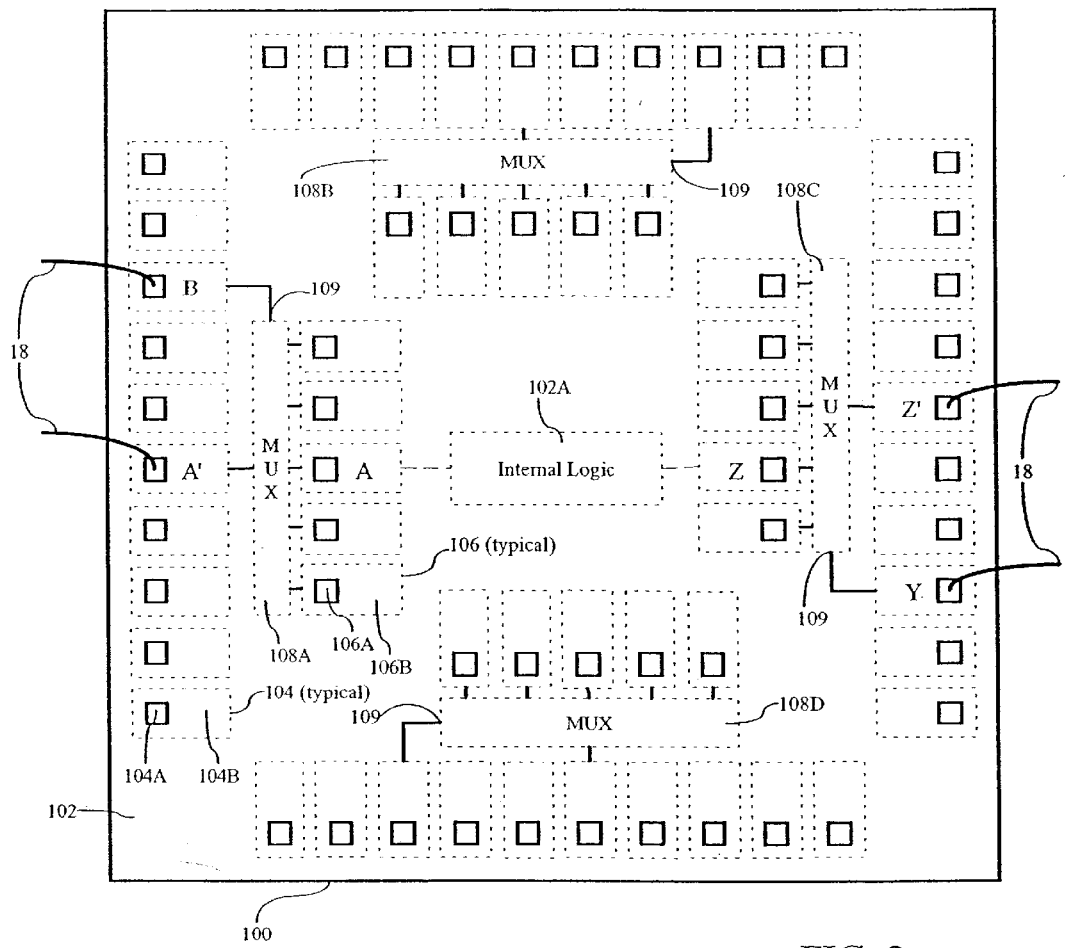
FIG. 2 is a block diagram of an IC prior to packaging in accordance with the present invention.

FIG. 2 depicts a preferred embodiment of an IC 100 in accordance with the present invention. The IC 100 comprises outside row buffer areas 104, inside row buffer areas 106, multiplexers 108A–D, and IC logic 102 (including internal logic 102A). The internal logic 102A is directly accessible through one or more inside row buffer areas 106 (e.g., inside row buffer areas A and Z). In addition, in accordance with the present invention, the internal logic 102A which is directly accessible from an inside row buffer area 106 is indirectly accessed through outside row buffer areas 104 via multiplexers 108A–D coupled between the outside row buffer areas 104 and the inside row area 106 (e.g., outside row buffer areas A' and Z').

Each outside row buffer area 104 comprises an outside row bonding pad 104A and an outside row buffer 104B. The outside row buffer 104B electrically connects the bonding pad 104A with IC logic 102 of the IC 100. In the preferred embodiment, each outside row buffer 104B comprises a bi-directional buffer (i.e., a buffer which allows data to flow through the buffer in two directions) having an input stage and an output stage. In an alternative embodiment, the outside row buffer 104B comprises uni-directional buffers (buffers which only allow data to flow in one direction) or a combination of unidirectional and bi-directional buffers.

Figure 2A:
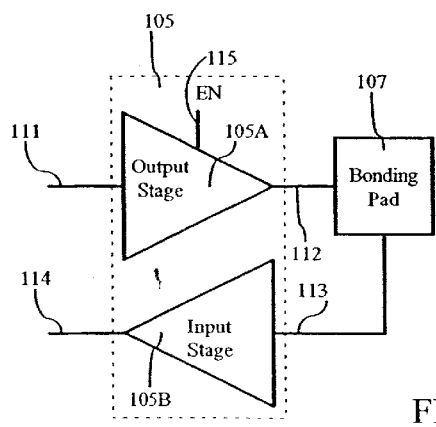
FIG. 2A is a block diagram of a prior art buffer area.

A block diagram of a bi-directional buffer for use in the present invention is shown in FIG. 2A. The bi-directional buffer 105 consists of an output stage 105A having an input 111 for coupling to the IC logic 102 (FIG. 2) and an output 112 coupled to a bonding pad 107, and an input stage 105B having an input 13 coupled to the bonding pad 107 and an output 114 for coupling to the IC logic 102. Preferably, the output stage 105A is controlled through an enable lead (EN) 115. In the preferred embodiment, the enable lead 115 is manipulated such that during "normal"operation, the impedance of the output stage 105A is high, thereby allowing a corresponding input stage 105B to operate without interference from the output stage 105A. In addition, the enable lead 115 is manipulated such that during "testing," the impedance of the output stage 105A is low, thereby allowing signals at an input of the output stage 105A to pass to an input of a corresponding input stage 105B.

Each inside row buffer areas 106 comprises an inside row bonding pad 106A and an inside row buffer 106B. The inside row buffer 106B electrically connects the bonding pad 106A with the IC logic 102 of the IC 100. The inside row buffer 106B consists essentially of bi-directional buffers 107 (FIG. 2A) at every inside row buffer 106B used to test internal logic such as internal logic 102A. In the preferred embodiment, each inside row buffer area 106 comprises a bi-directional buffer 107.

The IC logic 102 is conventional IC logic within a semiconductor wafer which includes resistors, capacitors, and transistors that function as different electronic components (e.g., amplifiers, oscillators, timers, counters, computer memories, or microprocessors). The internal logic 102A is logic contained within the IC which is directly accessible (i.e., accessible through one buffer area) through one or more of the inside row buffer areas 106. For illustrative purposes, the internal logic 102A is depicted as coupled between two inside row buffer areas 106, however, the internal logic may have an input coupled to an outside row buffer area 104 and an output coupled to an inside row buffer area 106, an input coupled to an inside row buffer area 106 and an output coupled to an outside row buffer area 104, or multiple inputs and outputs coupled between various outside and inside row buffer areas 104 and 106.

In the illustrated example, the internal logic 102A can be accessed indirectly (i.e., accessible through a series of buffer areas) through the outside row buffer areas 104. For example, the internal logic 102A can be indirectly accessed by supplying a test signal to an outside row buffer area A' coupled to an inside row buffer area A through a multiplexer 108A and observing a resultant signal at another outside row buffer area Z' coupled to another inside row buffer area Z through another multiplexer 108C.

The multiplexers 108A–D are conventional multiplexers which enable a signal from one buffer area to reach another (e.g., from an outside row buffer area A' to an inside row buffer area A). The signal on a bonding pad of an outside row buffer area 104 can be directed to an inside row buffer area 106 through the use of a routing signal at a control terminal 109 of a multiplexer 108A–D. The routing signal 109 configures the multiplexer 108A–D such that it will establish a connection between specific buffer areas. For example, a test signal at the outside row buffer area A' could be routed to the inside row buffer area A by supplying an appropriate routing signal to the control terminal 109 of an appropriate multiplexer 108A–D (e.g., multiplexer 108A) via another outside row buffer area (e.g., outside row buffer area B). The test signal could then be applied to the internal logic 102A and a resultant signal could be observed by supplying another routing signal to another multiplexer 108A–D (e.g., multiplexer 108C) which routes the resultant signal from the inside row buffer area Z to the outside row buffer area Z'.

In a preferred embodiment, multiple multiplexers 108A–D are used to establish connections between the outside row buffer areas 104 and the inside row buffer areas 106. In an alternative embodiment, a single multiplexer (e.g., positioned within the IC 100 near its perimeter between the outside row buffer areas 104 and the inside row buffer areas 106) is used to connect the inside and outside row buffer areas 104 and 106 used for testing. In another embodiment, other types of routing circuitry, such as application specific circuitry used exclusively for testing, are used to connect the outside row buffer areas 104 with the inside row buffer areas 106. Any conventional routing circuitry which can selectively establish connections between the outside row buffer areas 104 and the inside row buffer areas 106 will suffice for the purpose of the present invention. The connection of outside row buffer areas 104 to inside row buffer areas 106 will be readily apparent to those skilled in the art.

Figure 3:
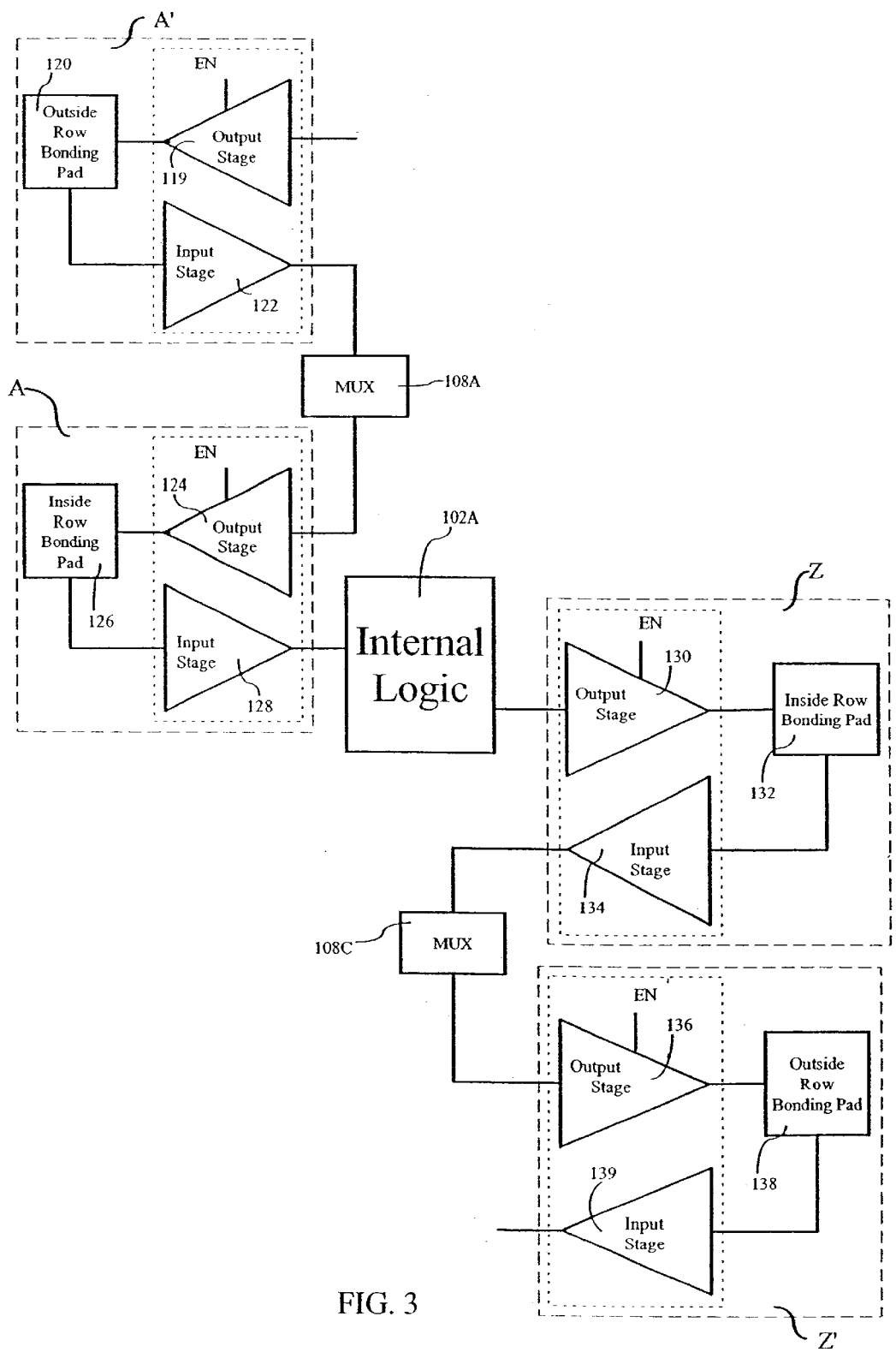
FIG. 3 is a block diagram illustrating the connections used for testing internal logic in accordance with the present invention.

FIG. 3 depicts an example of the interconnection of the buffer areas which allows the internal logic 102A to be wafer tested in accordance with the preferred embodiment of the present invention.

In the embodiment depicted in FIG. 3, a test signal is applied to an outside row bonding pad 120 of an outside row buffer area A' and passes through an input stage 122 of the outside row buffer area A'. In the present example, the output stage 119 is not used for this particular test. The multiplexer 108A then routes the test signal from the outside row buffer area A' to the inside row buffer area A. Preferably, the multiplexer 108A couples the output of the input stage 122 of the outside row buffer area A' to the input of the output stage 124 of the inside row buffer area A. Next, the test signal at the input of the output stage 124 drives the inside row bonding pad 126, which in turn drives the input stage 128 of the buffer area A. The test signal is then applied to the internal logic 102A by the input stage 128. The internal logic 102A processes the test signal and produces a resultant signal. The resultant signal drives the output stage 130 of another inside row buffer area Z, which in turn drives the input stage 134 of the inside row buffer area Z. The multiplexer 108C then routes the resultant signal from the output of the input stage 134 of the inside row buffer area Z to the input of the output stage 136 of the outside row buffer area Z'. Finally, the resultant signal can be observed using conventional testing equipment at the outside row bonding pad 138. In the present example, the input stage 139 is not used for this particular test. This arrangement allows signals at the outside row bonding pad 120 of the outside row buffer area A' to affect changes at the outside row bonding pad 138 of the outside row buffer area Z'(and, thus, the inside row buffer areas A and Z), which allows the entire data path containing the internal logic 102A to be wafer tested using conventional testing equipment.

Figure 4:
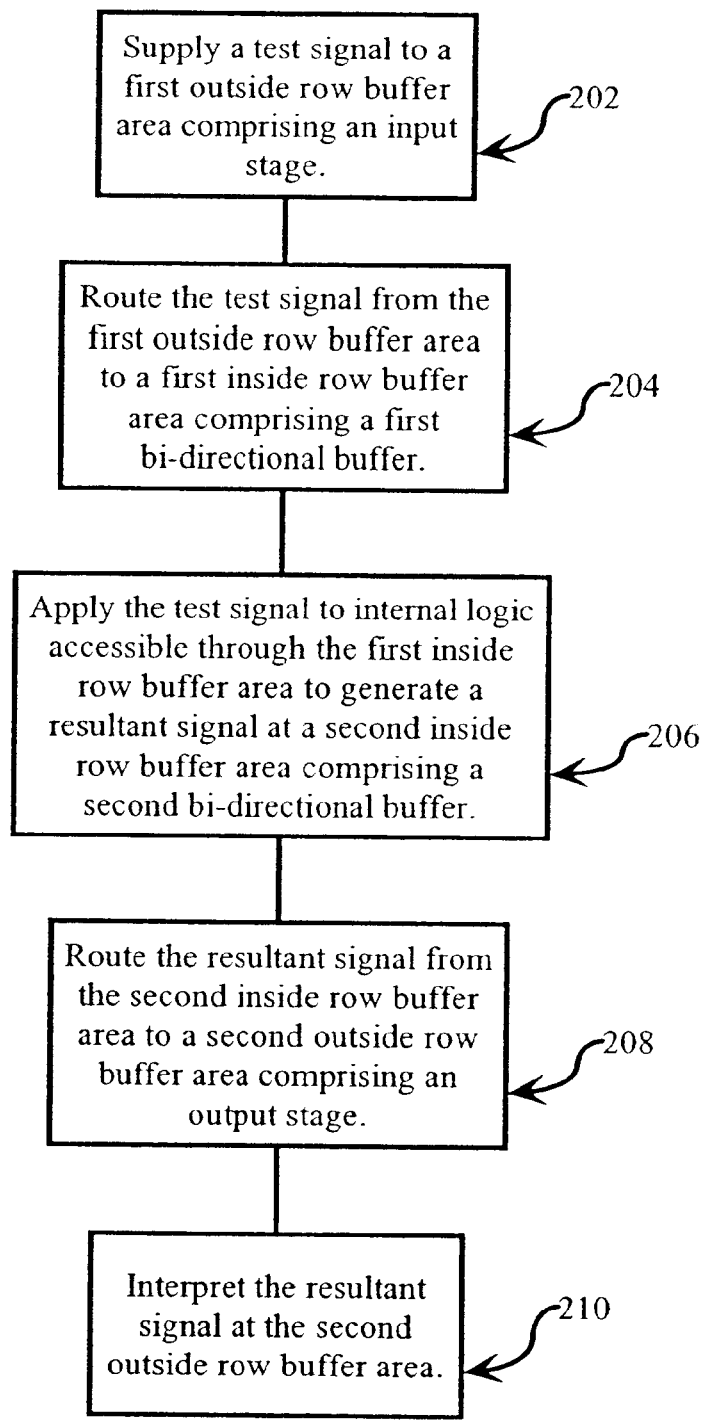
FIG. 4 is a flow chart of a method for testing internal logic in accordance with the present invention.

In use, the apparatus depicted in FIG. 2 can be fully tested during wafer testing through a method in accordance with the present invention by following the steps depicted in FIG. 4. The method comprises supplying a test signal to a first outside row buffer area, routing the test signal to internal logic accessible through one or more inside row buffer areas, applying the test signal to the internal logic to generate a resultant signal, routing the resultant signal to a second outside row buffer area, and interpreting the resultant signal at the second outside row buffer area.

At step 202, a test signal is supplied to a first outside row buffer area comprising an input stage. The first outside row buffer area is a buffer area positioned along the perimeter of an IC. In a preferred embodiment, the first outside row buffer area further comprises a bonding pad, and the test signal is supplied to the first outside row buffer area through a probe in contact with the bonding pad. In additional, in the preferred embodiment, the first outside row buffer area further comprises an output stage, with a bi-directional buffer comprising the input stage and the output stage. Preferably, the test signal is supplied to the bonding pad through the test probes of conventional testing equipment.

At step 204, the test signal is routed from the first outside row buffer area to the internal logic. In a preferred embodiment, the test signal is routed from the first outside row buffer area to a first inside row buffer area comprising a first bi-directional buffer having an input stage and an output stage. Since a bi-directional buffer is used, the test signal will pass from the output stage of the bi-directional buffer to the input stage of the bi-directional buffer. In a preferred embodiment, the test signal is routed from the input stage of the first outside row buffer area to an output stage of the first inside row buffer area. Preferably, the routing is performed through the use of a multiplexer coupled between the first outside row buffer area and the first inside row buffer area wherein the step of routing the test signal comprises configuring the multiplexer to establish a connection between the first outside row buffer area and the first inside row buffer area. In an alternative embodiment, if the internal logic is directly accessible from the first outside row buffer area, the test signal can be routed directly to the internal logic.

In the preferred embodiment, the multiplexer is configured via a control signal received at the multiplexer from a third outside row buffer area having an input stage. Preferably, the control signal is supplied to the third outside row buffer area through a conventional test probe which contacts the bonding pad of the third outside row buffer area.

At step 206, the test signal is applied to the internal logic. In the preferred embodiment, the test signal is applied to the internal logic through the first inside row buffer area to generate a resultant signal at a second inside row buffer area comprising a second bi-directional buffer. Since a bi-directional buffer is used, the resultant signal will pass from an output stage of the bi-directional buffer to an input stage of the bi-directional buffer. In the preferred embodiment, the test signals is supplied to an input of the internal logic and the resultant signal is generated at an output of the internal logic which is coupled to an output stage of the second bi-directional buffer.

At step 208, the resultant signal is routed to a second outside row buffer area comprising an output stage. In the preferred embodiment, the resultant signal is routed from the second inside row buffer area to the second outside row buffer area. Preferably, the second outside row buffer area further comprises an input stage, with a bi-directional buffer comprising the input stage and the output stage. In an alternative embodiment, if the internal logic is directly accessible from the second outside row buffer area, the resultant signal can be routed directly to the second outside row buffer area.

In the preferred embodiment, the resultant signal is routed through the use of a multiplexer. Preferably, the routing of the resultant signal includes configuring a second multiplexer to establish a connection between the second inside row buffer area and the second outside row buffer area by supplying a control signal to the multiplexer which was received from a fourth outside row buffer area having an input stage. In an alternative embodiment, the routing of the resultant signal is performed by configuring the multiplexer used to route the test signal of step 204 to further route the resultant signal between the second inside row buffer area and the second outside row buffer area.

At step 210, the resultant signal is interpreted at the second outside row buffer area. In the preferred embodiment, the resultant signal is available at a bonding pad of the second outside row buffer area which is contacted by a probe of conventional testing equipment.

Having thus described a few particular embodiments of the invention, various alterations, modifications, and improvements will readily occur to those skilled in the art. For example, the test signal routing within the IC is performed using several multiplexers, however, the routing may be performed with a single multiplexer, a combination of multiplexers and de-multiplexers, or other well known routing method. In addition, bi-directional buffers may be used at every buffer area, essentially every buffer area, or only at buffer areas where they are necessary for the testing of internal logic. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. A wafer testable integrated circuit (IC), comprising:
   a first outside row buffer area;
   a first inside row buffer area coupled to logic within the IC, said first inside row buffer area comprising at least a first bi-directional buffer;
   routing circuitry coupled between said first outside row buffer area and said first inside row buffer area for coupling said first inside row buffer area and said first outside row buffer area such that a signal can be passed between said first outside row buffer area and said logic within the IC coupled to said first inside row buffer area.

2. The IC of claim 1, further comprising:
   a second outside row buffer area;
   a second inside row buffer area comprising at least a second bi-directional buffer wherein said logic is coupled between said first and second inside row buffer area; and
   second routing circuitry coupled between said second outside row buffer area and said second inside row buffer area for coupling said second inside row buffer area and said second outside row buffer area such that said logic can be tested by supplying a test signal to said first outside row buffer area and observing a resultant signal at said second outside row buffer area.

3. The IC of claim 1, further comprising:
   a second outside row buffer area wherein said logic is coupled between said first inside row buffer area and said second outside row buffer area, wherein said logic can be tested by supplying a test signal to said first outside row buffer area and observing a resultant signal at said second outside row buffer area.

4. The IC of claim 1, further comprising:
   a second outside row buffer area wherein said logic is coupled between said first inside row buffer area and said second outside row buffer area, wherein said logic can be tested by supplying a test signal to said second outside row buffer area and observing a resultant signal at said first outside row buffer area.

5. The IC of claim 1, wherein said first outside row buffer areas comprise at least a second bi-directional buffer.

6. The IC of claim 1, wherein said first bi-directional buffer comprises:
   an input stage having an input coupled to a bonding pad of said first inside row buffer area and an output coupled to said logic; and
   an output stage comprising an output coupled to said bonding pad and an input coupled to said logic.

7. The IC of claim 6, said output stage further comprising an enable lead coupled to said routing circuitry, wherein the impedance of the output stage is regulated through said enable lead such that the impedance is high when the output stage is inactive, thereby allowing the input stage to operate without interference from the output stage, and the impedance is low when the output stage is active, thereby allowing signals at an input of that output stage to pass to the input of a corresponding input stage during testing.

8. The IC of claim 1, wherein said routing circuitry comprises at least one multiplexer.

9. A wafer testable integrated circuit (IC), comprising:
   a plurality of outside row buffer areas;
   a plurality of inside row buffer areas;
   internal logic coupled to at least one of said plurality of inside row buffer areas; and
   routing circuitry coupled between said plurality of outside row buffer areas and said plurality of inside row buffer areas for establishing connections between said plurality of inside row buffer areas and said plurality of outside row buffer areas to test said internal logic from said plurality of outside row buffer areas.

10. The IC of claim 9, wherein said at least one of said plurality of inside row buffer areas comprises at least a bi-directional buffer.

11. The IC of claim 9, wherein each of said plurality of inside row buffer areas comprises at least a bi-directional buffer.

12. The IC of claim 11, wherein each of said plurality of outside row buffer areas comprises at least a bi-directional buffer.

13. The IC of claim 12, wherein each of said bi-directional buffers comprises:

an input stage having an input coupled to a bonding pad of a corresponding buffer area and an output coupled to logic within the IC; and an output stage having an output coupled to said bonding pad and an input coupled to said logic.

14. The IC of claim 13, said output stage further comprising an enable lead coupled to said routing circuitry, wherein the impedance of the output stage is regulated through said enable lead such that the impedance is high when the output stage is inactive, thereby allowing the input stage to operate without interference from the output stage, and the impedance is low when the output stage is active, thereby allowing signals at an input of that output stage to pass to the input of a corresponding input stage during testing.

15. The IC of claim 9, wherein said routing circuitry comprises at least one multiplexer.

16. The IC of claim 15, wherein said at least one multiplexer is controlled via a control signal received through at least one of said plurality of outside row buffer areas.

17. A method for wafer testing internal logic directly accessible at one or more inside row buffer areas in an integrated circuit (IC) through outside row buffer areas, said method comprising the steps of:

supplying a test signal to a first bonding pad of a first outside row buffer area having an input stage;

routing said test signal from said first outside row buffer area to an input of the internal logic;

applying said test signal to the internal logic to generate a resultant signal at an output of the internal logic;

routing said resultant signal to a second outside row buffer area having an output stage; and interpreting said resultant signal at a second bonding pad of said second outside row buffer area.

18. The method of claim 17, wherein said step of routing said test signal comprises the step of:

routing said test signal from said first outside row buffer area to a first inside row buffer having a bi-directional buffer coupled to said input of the internal logic.

19. The method of claim 18, wherein said step of routing said test signal comprises the step of:

configuring a first multiplexer within the IC to establish a connection between said first outside row buffer area and said first inside row buffer area via a control signal received at said multiplexer from a third outside row buffer area comprising an input stage.

20. The method of claim 19, wherein said step of routing said resultant signal comprises the step of:

routing said resultant signal from a second inside row buffer having a bi-directional buffer coupled to said output of the internal logic.

21. The method of claim 20, wherein said step of routing said resultant signal comprises the step of:

configuring a second multiplexer within the IC to establish a connection between said second inside row buffer area and said second outside row buffer area via a control signal received from a fourth outside row buffer area comprising an input stage.

22. The method of claim 20, wherein said step of configuring said first multiplexer further comprises establishing a connection between said second inside row buffer area and said second outside row buffer area.

23. The method of claim 17, wherein said step of routing said resultant signal comprises the step of:

routing said resultant signal from a second inside row buffer having a bi-directional buffer coupled to said output of the internal logic.

24. The method of claim 23, wherein said step of routing said resultant signal comprises the step of:

configuring a first multiplexer within the IC to establish a connection between said second inside row buffer area and said second outside row buffer area via a control signal received from a third outside row buffer area comprising an input stage.

* * * * *